United States Patent [19]
Debbaut

[11] Patent Number: 4,634,207
[45] Date of Patent: Jan. 6, 1987

[54] APPARATUS AND METHOD FOR PROTECTION OF A SUBSTRATE

[75] Inventor: Christian A. Debbaut, Cary, N.C.

[73] Assignee: Raychem Corporation, Menlo Park, Calif.

[21] Appl. No.: 504,000

[22] Filed: Jun. 13, 1983

Related U.S. Application Data

[63] Continuation-in-part of Ser. No. 434,011, Oct. 12, 1982.

[51] Int. Cl.$^4$ .............................................. H01R 13/52
[52] U.S. Cl. .................... 339/116 C; 29/877; 174/76
[58] Field of Search ........... 339/116 R, 116 C, 115 R, 339/115 C, 143 R, 49 B; 29/877, 862, 863

[56] References Cited

U.S. PATENT DOCUMENTS

| | | | |
|---|---|---|---|
| 3,731,258 | 5/1973 | Spicer | 339/49 B X |
| 3,897,129 | 7/1975 | Farrar, Jr. | 339/116 C |
| 4,369,284 | 1/1983 | Chen . | |

*Primary Examiner*—Z. R. Bilinsky
*Attorney, Agent, or Firm*—Dennis E. Kovach; Stephen C. Kaufman; Timothy H. P. Richardson

[57] ABSTRACT

An apparatus and method for protection of a substrate, e.g. an electrical contact. The apparatus comprises a support member and an encapsulant which has a cone penetration value of 100 to 350 ($10^{-1}$ mm) and an ultimate elongation of at least 200%, and preferably an elastic modulus of less than $10^7$ dynes/cm$^2$. The encapsulant and the substrate are pressed together so that the encapsulant is deformed into close and conforming contact with the substrate. Preferably at least part of the deformation is elastic deformation.

40 Claims, 3 Drawing Figures

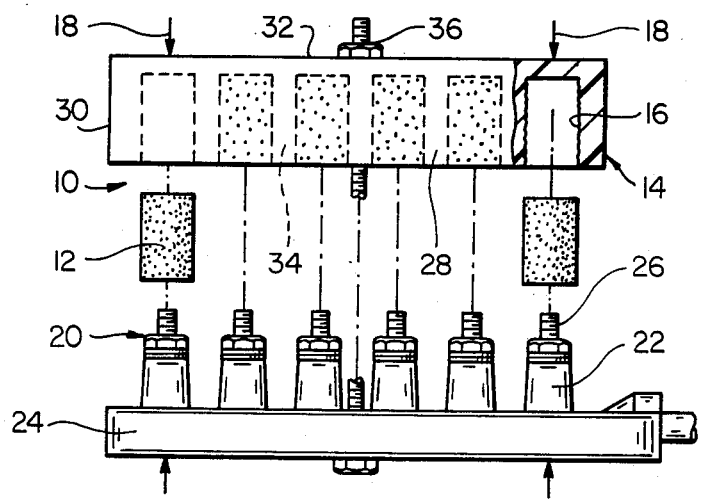
FIG_1
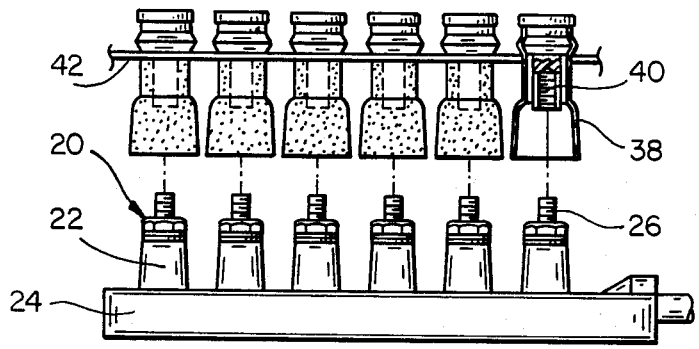
FIG_2A
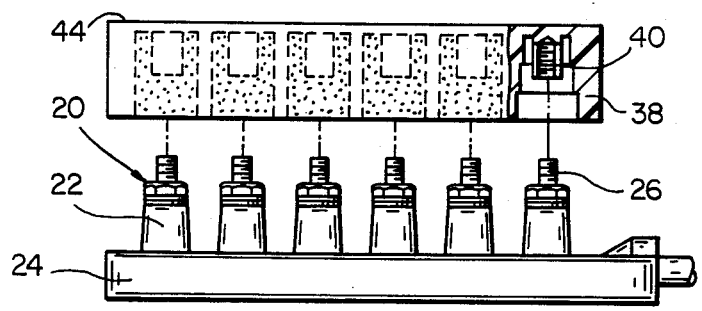
FIG_2B

APPARATUS AND METHOD FOR PROTECTION OF A SUBSTRATE

CROSS REFERENCE TO RELATED APPLICATION

This application is a continuation-in-part of application Ser. No. 434,011, filed Oct. 12, 1982, the entire disclosure of which is incorporated herein by reference.

TECHNICAL FIELD

The present invention relates to protective covers for substrates, particularly electrically conductive substrates.

BACKGROUND ART

A wide variety of substrates require protection from adverse environmental conditions, including moisture, insects, dirt, plant life and corrosion deposits. In some cases, especially when electrical contacts are to be protected, it is desirable to provide a removable protective cover over the substrate, so that it is possible easily to reenter and work on the sealed substrate. It is known to use greases to protect electrical contacts, the grease being contained in a container which is applied to the electrical contact(s)—see for example U.S. Pat. No. 3,897,129 (Farrar). However, the grease is a thixotropic fluid, which places limitations on the ways in which it can be used. Furthermore, when reentry to the sealed contact is required, when the container is removed, grease remains coated on the contact(s) and must be cleaned off before electrical work can begin. It is also known to encapsulate electrical contacts within a container by means of a two-part liquid composition prepared by mixing ingredients which will react slowly together. Before the ingredients have gelled, the mixture is poured into the container, where it cures in situ to form a hard gel—see U.S. Pat. Nos. 4,375,521 (Arnold) and 4,102,716 (Graves). However, this procedure involves preparation of the liquid composition at the site, delay while the composition gels, and the need to provide a container around the contact(s), into which the composition can be poured. Furthermore, when reentry to the encapsulated contacts is required, the gelled composition cannot easily be removed.

SUMMARY OF THE INVENTION

I have now discovered that excellent encapsulation of electrical contacts (and other substrates) can be obtained through the use of gels which have been pre-formed in the absence of the substrate (and like compositions); the pre-formed gel and the substrate to be encapsulated are pressed against each other, thus deforming the gel into close and conforming contact with the substrate. Preferably, at least a part of the deformation is elastic deformation. The preferred properties of the gel depend upon the substrate to be encapsulated, as further discussed below, but I have found that in all cases, it is essential for the gel to be relatively soft by comparison with the gels formed in situ in the known processes. Thus the gels formed in situ have cone penetration values of less than 75, whereas the novel encapsulants of this invention have cone penetration values of at least 100. Cone penetration values given in this specification are expressed in units of $10^{-1}$ mm and are measured by ASTM D217-68 at 70° F.±5° F., on an undisturbed sample using a standard 1:1 scale cone (cone weight 102.5 g, shaft weight 47.5 g), the penetration being measured after 5 seconds. In addition, the novel encapsulants should have an elongation of at least 200%. Elongation values given in this specification are ultimate elongations measured by ASTM D638-80 at 70° F.±5° F., using a Type 4 die to cut the sample and at a speed of 50 cm/minute.

The novel encapsulant can be adherent to any suitable support member. Especially when it is desirable that the encapsulant should be removable from the electrical contact or other substrate which it is protecting, the encapsulant preferably has an adhesive strength to the substrate which is less than its adhesive strength to the support member and less than its cohesive strength, so that the encapsulant can be cleanly removed from the substrate merely by separating the support member and the substrate, leaving little or none of the encapsulant on the substrate. When the encapsulation of the substrate involves pushing at least part of the substrate through the encapsulant so that the encapsulant is parted and then flows back to form a seal on the other side of the substrate, the seal is a plane of weakness which will in many cases separate cleanly when the encapsulant is removed. This is in contrast to the situation when an encapsulant is gelled in situ, when no such plane of weakness exists.

In one aspect, the present invention provides an apparatus for providing a protective covering over a substrate, the apparatus comprising a support member and an encapsulant, the encapsulant being adherent to the support member and being composed of a material which has a cone penetration value of 100 to 350 and an ultimate elongation of at least 200%.

In another aspect, the invention provides a process for providing a protective covering over a substrate, which process comprises pressing together the substrate and an apparatus as defined above, the apparatus and the substrate being pressed together so that the encapsulant contacts the substrate and is deformed into close and conforming contact therewith.

BRIEF DESCRIPTION OF THE DRAWINGS

The invention is illustrated in the accompanying drawings in which:

FIG. 1 is an exploded view of one embodiment of the present invention; and

FIGS. 2a and b show alternative embodiments of the present invention.

DETAILED DESCRIPTION OF THE INVENTION

The encapsulants used in the present invention have cone penetration values of 100 to 350, with values of 150 to 350, especially 200 to 300, being preferred for processes in which the pressure exerted on the encapsulant during installation is relatively low, as for example in the encapsulation of electrical terminals as described in connection with the drawing. When the volume of the encapsulant (or each mass of encapsulant) is relatively large (e.g. more than 3 cc), the cone penetration value of the encapsulant is preferably 200 to 250. When the volume is relatively small (e.g. less than 3 cc), the cone penetration value is preferably 250 to 350.

The elongation of the encapsulant is at least 200%, and substantially higher values are preferred, e.g. at least 500%, particularly at least 750%. The tensile strength of the encapsulant is generally less, often very much less, than 20 psi (measured by ASTM D638-80 under the same conditions as the elongation).

The elastic modulus of the encapsulant is also significant, since it affects the ability of the encapsulant to make intimate contact with the substrate. When measured at 70° F. 5° F., using a parallel plate rheometric test at a frequency of 1 Hz, the encapsulant generally has an elastic modulus less than $10^7$ dynes/cm$^2$, preferably less than $10^6$ dynes/cm$^2$, particularly less than $10^5$ dynes/cm$^2$.

Suitable materials for the encapsulant (which is usually electrically insulating, but is not necessarily so for some possible uses of the invention, e.g. when non-electrical substrates are being protected) can be made by gelling curable polyurethane precursor materials (as described for example in the patents referenced above) in the presence of substantial quantities of a mineral oil, a vegetable oil or a plasticizer, or a mixture of two or more of these. Thus I have obtained excellent results using encapsulants prepared by gelling components which are commerically available for the preparation of polyurethane gels in situ, the gelation being carried out, however, in the presence of a suitable amount e.g. 30 to 70% by weight, of a suitable plasticizer, e.g. a trimellitate, or in the presence of a suitable animal or vegetable oil, e.g. 80 to 60%, preferably 80 to 70%, by weight of a mixture of mineral and vegetable oils in which the ratio by weight of mineral oil to vegetable oil is 0.7 to 2.4. Other suitable encapsulants can be prepared by curing reactive silicones with non-reactive extender silicones.

A wide variety of support members are useful in the present invention. In some cases a conventional rectangular container, having side walls, end walls and a bottom wall, is satisfactory. When a plurality of adjacent contacts are to be encapsulated, it is often useful for the support member to comprise a plurality of individual open containers, which are connected to each other, e.g. through a flexible connection means, and each of which contains a separater mass of encapsulant. The separate containers can be applied simultaneously or sequentially to the contacts. The support member can be of any material, but preferably it is composed of an organic polymer or some other insulator. The support member can be recoverable, preferably heat-recoverable, in which case the process for applying the protective covering to the substrate includes a step in which the support member is recovered. When using a recoverable substrate, the elastic modulus of the encapsulant is particularly important, but the elongation can be substantially less than 200%, e.g. as little as 50%, though preferably at least 100%.

Especially when at least part of the deformation of the encapsulant is elastic deformation, it is often necessary to provide a force member for maintaining the encapsulant in compressive contact with the substrate. The force member is preferably secured to or forms part of the support member, but can be separate from it. The force member can be such that it becomes secured to the substrate when the substrate and the protective apparatus are pressed together. For example the force member can lie within the encapsulant and engage the substrate to which the encapsulant is applied.

Reference is now made to FIG. 1 which provides an exploded view of one embodiment of a protection apparatus 10 made in accordance with the principles of the present invention. As shown in FIG. 1, the apparatus 10 includes these component elements: an encapsulant 12 (whose further particular characteristics are set forth below); a first means 14 to contain the encapsulant 12 (here shown as a partitioned housing); a second means 16 to assist in retaining the encapsulant within the first means 14 (i.e. the housing); and a force means 18 (shown symbolically in FIG. 1 as force vectors). The force means 18 acts on the first means 14 so that the encapsulant 12 is maintained in compressive contact with an electrical contact 20 that is located on a polymeric support substrate 22 of a conventional termination block 24. At the same time, the force means 18 acts on the first means 14 so that the encapsulant 12 substantially encapsulates a conductive portion 26 of the electrical contact 20.

The protection apparatus 10 shown in FIG. 1 has the following important feature: if there is a release of the force means 18 and a disengagement of the first means 14 from the termination block 14, the encapsulant 12 remains substantially with the first means 14 (i.e. the partitioned housing). The encapsulant 12, moreover, is cleanly as well as immediately removed from the electrical contact 20. This unique feature enables the craftsperson to reenter the termination block 24 numerous times to effect repairs or change service wires connected to the electrical contact 20. In all such cases of reentry, the encapsulant 12 remains substantially in the partitioned housing so that the craftsperson can make repairs without obstruction or delay. After any repair is made, the craftsperson insures that the electrical contact 20 is environmentally protected by a method that includes the steps of:

1. providing the encapsulant 12;
2. providing the first means 14 of containing the encapsulant 12;
3. providing the second means 16 for retaining the encapsulant 12 within the first means 14; and
4. applying the force means 18 for acting on the first means 14 so that the encapsulant 12 is maintained in compressive contact with the electrical contact 20 and the support substrate 22 and substantially encapsulates the conductive portion 26 of the electrical contact 20.

There is now provided a more detailed description of the component elements of the protection apparatus 10 of the present invention. It is to be understood, however, that the information given below is not limited to the apparatus as shown in FIG. 1.

The encapsulant 12 characterized by these stated features may contain known additives such as moisture scavengers (e.g. benzoyl chloride), antioxidants, pigments and fungicides, etc. (all well known in the art). Other specific compositions for an encapsulant 12 are conceivable and may be employed within the scope of the present invention.

The encapsulant 12 as just disclosed is electrically insulating as it has a volume resistivity of at least approximately $10^9$ ohms centimeter. Additionally, the encapsulant 12 is hydrolytically stable, moisture insensitive, substantially inert towards the substrate 22 and tacky. The surface(s) of the encapsulant 12 which do not contact the support member can be covered by a release sheet (not shown) which is removed before the protective apparatus is used. Such a release sheet may be unnecessary or even disadvantageous when the encapsulant lies wholly within a container-shaped support member. On the other hand, when the encapsulant protrudes from the support member, and especially when the encapsulant is sticky (as are the polyurethane gels referred to above), the use of a release sheet may be essential or highly desirable if a number of protective members are to be stored together.

As described above, the protection apparatus 10 includes the first means 14 to contain the encapsulant 12. In FIG. 1, the first means 14 is realized by a partitioned housing. The partitioned housing includes side walls 28, end walls 30, a bottom wall 32 and a plurality of partitions 34. In this embodiment, each partition included within the plurality of partitions 34 encapsulates an electrical contact 20. The partitioned housing may be composed of a plastic material.

The first means 14 may also be realized by a non-partitioned housing or "open-through" type design (not shown). Other specific embodiments for the design and type of material to be employed in the realization of the first means 14 are conceivable and may be made within the scope of the present invention as heretofore described.

It is also indicated above that the protection apparatus 10 includes the second means 16 to retain the encapsulant 12 within the first means 14 (i.e. the partitioned housing). In general, the second means 16 to retain the encapsulant 12 may include means to provide a surface area of the first means greater than a surface area of the electrical contact 20. To this end, the second means 16 may be realized by a conventional surface treatment process that include abrasion of the surface wall areas of the partitions of the inclusion of material protrusions (not shown) within the included partitions. The second means 16 to retain the encapsulant 12 may also be a surface which has undergone a surface activation procedure such as a corona treatment or a chemical treatment to enhance adhesion of the encapsulant 12 to the first means 14.

Finally, it is indicated above that the protection apparatus 10 includes the force means 18, shown symbolically as force vectors in FIG. 1. In one embodiment of the present invention, the force means 18 is realized as a conventional nut and bolt assembly 36 which acts to insure that the encapsulant 12 is maintained in compressive contact with the electrical contact 20 and that the encapsulant 12 substantially encapsulates the conductive portion 26 of the electrical contact 20. Optimal results are secured if the force means 18 (e.g. the nut and bolt assembly) operates as a directional force that acts along an axis defined by the electrical contact 20. Other specific embodiments (not shown) that realize the force means 18 include conventional tie wraps, string or bailing wire assemblies. It is noted, moreover, that the force means 18 may be realized by a force that is substantially non-varying in time or is dynamic.

In the embodiment of the present invention shown in FIG. 1, the force means 18 is considered to be an independent element which acts on a concentrated load (i.e. the first means 14 that contains the encapsulant). The force developed by the force means 18 is effectively transmitted and distributed by way of the first means 14 so that the encapsulated 12 may be in compressive contact with each of a plurality of electrical contacts 20.

In an alternative embodiment of the present invention, on the other hand, the force means 18 is not, in fact, an independent element which acts on the concentrated load. Instead, the first means 14 is modified so that the force means 18 is inherent in the first means 14. Accordingly, the encapsulant 12 may be maintained in compressive contact with the electrical contacts 20 by way of a force inherent in the (now modified) first means 14 itself.

This alternative embodiment of the present invention is shown in one of its aspects in FIG. 2a and includes a means 38 to contain and retain the encapsulant 12 and to develop a force to maintain the encapsulant 12 in compressive contact with the electrical contact 20 and the support substrate 22. The means 38 is realized by way of a structure that includes a housing that has a generally bell shaped configuration. Thus, the housing has a narrow necked portion that opens up at one end so as to be able to fit over the electrical contact 20. Integral to the housing is a split retaining nut member 40 that has an internal threaded portion that is complementary with the threads of the electrical contact 20. The member 40 is split so that it may be pushed axially onto the electrical contact 20, without threading it during this pushing action. On the other hand, the member 40 is internally threaded so that it can grip the electrical contact 20 upon the cessation of the pushing action, thus realizing the force that maintains the encapsulant 12 in compressive contact with the electrical contact 20 and the support substrate 22.

In sum, the alternative embodiment of the present invention shown in FIG. 2a includes the means 38 which (1) contains the encapsulant 12; (2) retains the encapsulant 12 (in the manner established above); and (3) develops a force to maintain the encapsulant 12 in compressive contact with the electrical contact 20 and the support substrate 22. The means 38, as shown by way of the FIG. 2a embodiment, may be realized by a conventional polymeric or elastomeric material. A plurality of the means 38 elements, moreover, may be connected together by way of a connecting ribbon 42. The ribbon 42 facilitates the job of the craftsperson, wherein an array of electrical contacts 20 are serviced as a group, and re-entry is effected simply by pulling the ribbon 42 away from the termination block 24. To the same end, note another embodiment of the present invention, shown in FIG. 2b, wherein the means 38 is realized by a uniblock device 44 that is molded to fit over the entire termination block 24.

The present invention, as heretofore disclosed, provides apparatus and method for protection of electrical contacts. The principles of the present invention, however, are more general and extend to apparatus and method for providing a protective covering over any substrate e.g. the support substrate 22. The generalized apparatus and method of the present invention is now disclosed.

As generalized, then, the apparatus includes a protective member (not shown) which comprises a support member and an encapsulant which is adherent to the support member. The encapsulant has a cone penetration value of at least 100, preferably 150 to 350 ($10^{-1}$ mm) and an ultimate elongation of at least 200%. Note in this context that the support member may be recoverable, in particular heat-shrinkable, wherein its dimensional configuration may be made to change when subjected to heat treatment.

As generalized, also, the method of the present invention includes a process for providing a protective covering over a substrate, and comprises the steps of:
(a) pressing together the substrate and a protective member comprising a support member and an encapsulant which is adherent to the support member. The encapsulant preferably has a cone penetration value of 150 to 350 ($10^{-1}$ mm) and an ultimate elongation of at least 200% and an adhesive strength to the substrate which is less than its adhesive strength to the support member and less than its cohesive strength. The protective member and the substrate are pressed together so that the encapsulant contracts the substrate and is deformed into close and conforming contact with the substrate; preferably at least a part of the deformation is elastic deformation; and (b) maintaining the encapsulant in contact with the substrate.

The present invention, in summary, may be employed to provide a protection apparatus for a substrate of the type that may include e.g. an electrical contact. Although specific embodiments of the present invention have been described herein, it will be obvious to those skilled in the art that various modifications may be made without departing from the spirit of this invention. With such included modifications, the present invention is suitable for employment with a wide variety of devices including termination blocks, telephone connectors or conventional splice connectors like a butt-splice wire connector. In all such cases of employment, a craftsperson can make numerous reentrys to the device while ensuring that the substrate therein is protected when it is located in an adverse environment. With the foregoing in mind, it is understood that the invention be accorded the full scope of the appended claims.

I claim:

1. Apparatus for protecting a substrate, comprising:
a gel, the gel being cured prior to coming into contact with any part of a substrate to be protected, the gel having a cone penetration value of 100 to 350 ($10^{-1}$ mm) and an ultimate elongation of at least 200%; and
means for deforming the gel into close and conforming contact with the substrate.

2. Apparatus as claimed in claim 1, the deforming means maintaining the gel in compressive contact with the substrate.

3. Apparatus as recited in claim 2, wherein the deforming means is secured to said support member.

4. Apparatus as recited in claim 3 wherein the deforming means lies within the gel.

5. Apparatus as recited in claim 4, wherein the support member is generally bell-shaped, and the deforming means is a split retaining member that has an internal threaded portion.

6. Apparatus as claimed in claim 2, the maintaining means being a dynamic force means.

7. The apparatus of claim 2, the gel being elastic.

8. Apparatus as recited in claim 1 wherein the gel has an elastic modulus of less than $10^7$ dynes/cm$^2$.

9. Apparatus as recited in claim 8 wherein said elastic modulus is less than $10^6$ dynes/cm$^2$.

10. Apparatus as recited in claim 1 wherein said cone penetration value is 150 to 350 ($10^{-1}$ mm).

11. Apparatus as recited in claim 1, wherein said cone penetration value is 200 to 300 ($10^{-1}$ mm).

12. Apparatus as recited in claim 1, wherein said gel has an elongation of at least 500%.

13. Apparatus as recited in claim 1, further comprising a release member which covers an otherwise exposed portion of said gel and which can be removed therefrom preparatory to covering the substrate.

14. Apparatus as recited in claim 1 wherein the gel is an oil-extended polyurethane.

15. Apparatus as recited in claim 14 wherein the gel has been prepared by gelling a liquid mixture comprising 20 to 40% of curable polyurethane precursor materials and 80 to 60% of a mixture of mineral oil and vegetable oil in which the raio by weight of mineral oil to vegetable oil is 0.7 to 2.4; the percentages being by weight based on the total weight of the polyurethane precursor materials and the mixture of mineral and vegetable oils.

16. Apparatus as recited in claim 1 wherein the gel is a plasticized polyurethane.

17. Apparatus as claimed in claim 1, properties of the gel being such that a plane of weakness is formed therein when deformed about the substrate by the deforming means.

18. Apparatus as claimed in claim 1, further comprising a support member, the gel being located on the support member, the gel having an adhesive strength to the substrate which is less than an adhesive strength to the support member.

19. Apparatus as recited in claim 18, wherein said support member comprises a plurality of individual open containers, which are connected to each other and each of which contains a separate mass of the gel.

20. Apparatus as recited in claim 19, wherein the individual containers are connected to each other by a flexible connector.

21. Apparatus as recited in claim 18, wherein said support member is composed of an organic polymeric material and is in the form of a housing that includes side walls, end walls and a bottom wall.

22. Apparatus as recited in claim 18, wherein at least part of said support member is heat-recoverable.

23. Apparatus as recited in claim 18 wherein the gel has an elastic modulus of less than $10^7$ dynes/cm$^2$.

24. Apparatus as recited in claim 23 wherein said elastic modulus is less than $10^6$ dynes/cm$^2$.

25. Apparatus as recited in claim 18 wherein said cone penetration value is 150 to 350 ($10^{-1}$ mm).

26. Apparatus as recited in claim 18 wherein said cone penetration value is 200 to 300 ($10^{-1}$ mm).

27. Apparatus as recited in claim 18 wherein said gel has an elongation of at least 500%.

28. Apparatus as recited in claim 18 further comprising a release member which covers an otherwise exposed portion of said gel and which can be removed therefrom preparatory to covering the substrate.

29. Apparatus as recited in claim 18 wherein the gel is an oil-extended polyurethane.

30. Apparatus as recited in claim 29 wherein the gel has been prepared by gelling a liquid mixture comprising 20 to 40% of curable polyurethane precursor materials and 80 to 60% of a mixture of minearl oil and vegetable oil in which the ratio by weight of mineral oil to vegetable oil is 0.7 to 2.4; the percentages being by weight based on the total weight of the polyurethane precusor materials and the mixture of mineral and vegetable oils.

31. Apparatus as recited in claim 18 wherein the gel is a plasticized polyurethane.

32. A process for protecting a substrate, comprising the steps of:
pressing together a substrate to be protected and an apparatus comprising a support member, a gel located on the support member, the gel being cured prior to coming into contact with any part of the substrate, the gel having a cone penetration value of 100 to 350 ($10^{-1}$ mm) and an ultimate elongation of at least 200%, and means for deforming the gel into close and conforming contact with the substrate, the apparatus and the substrate being pressed together so that the gel contacts the substrate and is deformed into close and conforming contact therewith.

33. A process as recited in claim 32 wherein at least a part of the deformation of the gel is elastic deformation.

34. A process as recited in claim 33 which comprises securing a force member to the substrate, thus maintaining the gel in compressive contact with the substrate.

35. A process as recited in claim 34 wherein the force member becomes secured to the substrate when the substrate and the apparatus are pressed together.

36. A process as recited in claim 32 wherein the substrate comprises at least one electrical contact.

37. A process as recited in claim 32 wherein the gel has an adhesive strength to the substrate which is less than its adhesive strength to the support member and less than its cohesive strength.

38. A process as recited in claim 32 wherein the gel is contained in at least one open container and has a cone penetration value of 200 to 300 ($10^{-1}$ mm).

39. A process as recited in claim 32 wherein the gel has an elongation of at least 500%.

40. A process as recited in claim 32 wherein at least a part of the support member is recoverable and the process includes a step in which the support member is recovered.

* * * * *